US011042803B2

United States Patent
Malkiel et al.

(10) Patent No.: US 11,042,803 B2
(45) Date of Patent: Jun. 22, 2021

(54) METHOD AND APPARATUS FOR USING GENERATIVE ADVERSARIAL NETWORKS IN MAGNETIC RESONANCE IMAGE RECONSTRUCTION

(71) Applicant: General Electric Company, Schenectady, NY (US)

(72) Inventors: Itzik Malkiel, Herzliya (IL); Christopher Judson Hardy, Schenectady, NY (US)

(73) Assignee: General Electric Company, Schenectady, NY (US)

( * ) Notice: Subject to any disclaimer, the term of this patent is extended or adjusted under 35 U.S.C. 154(b) by 102 days.

(21) Appl. No.: 16/276,135

(22) Filed: Feb. 14, 2019

(65) Prior Publication Data

US 2020/0265318 A1    Aug. 20, 2020

(51) Int. Cl.
| | |
|---|---|
| *G06K 9/00* | (2006.01) |
| *G06N 3/08* | (2006.01) |
| *G06N 3/04* | (2006.01) |
| *G06T 3/40* | (2006.01) |
| *G06N 20/20* | (2019.01) |

(52) U.S. Cl.
CPC ........... *G06N 3/088* (2013.01); *G06N 3/0454* (2013.01); *G06N 20/20* (2019.01); *G06T 3/4046* (2013.01); *G06T 2207/20081* (2013.01)

(58) Field of Classification Search
None
See application file for complete search history.

(56) References Cited

U.S. PATENT DOCUMENTS

| | | | |
|---|---|---|---|
| 9,542,761 B2 | 1/2017 | Tan et al. | |
| 9,846,214 B2 | 12/2017 | Zhou et al. | |
| 2018/0137389 A1* | 5/2018 | Mathieu | G06K 9/00718 |
| 2018/0249979 A1 | 9/2018 | Wang et al. | |
| 2019/0295223 A1* | 9/2019 | Shen | G06K 9/6256 |
| 2019/0333199 A1* | 10/2019 | Ozcan | G06N 3/0481 |
| 2019/0333219 A1* | 10/2019 | Xu | G06T 7/0014 |
| 2019/0355102 A1* | 11/2019 | Lin | G06T 5/005 |

(Continued)

FOREIGN PATENT DOCUMENTS

WO    2017223560    12/2017

OTHER PUBLICATIONS

Mirza, Mehdi, et al.; "Conditional Generative Adversarial Nets," arXiv preprint arXiv:1411.1784 (2014).

(Continued)

*Primary Examiner* — Wei Wen Yang (57) ABSTRACT

A method of reconstructing imaging data into a reconstructed image may include training a generative adversarial network (GAN) to reconstruct the imaging data. The GAN may include a generator and a discriminator. Training the GAN may include determining a combined loss by adaptively adjusting an adversarial loss based at least in part on a difference between the adversarial loss and a pixel-wise loss. Additionally, the combined loss may be a combination of the adversarial loss and the pixel-wise loss. Training the GAN may also include updating the generator based at least in part on the combined loss. The method may also include receiving, into the generator, the imaging data and reconstructing, via the generator, the imaging data into a reconstructed image.

19 Claims, 7 Drawing Sheets

(56) References Cited

U.S. PATENT DOCUMENTS

2020/0005511 A1* 1/2020 Kavidayal ............... G06N 3/088
2020/0034948 A1* 1/2020 Park ..................... A61N 5/1049

OTHER PUBLICATIONS

Szegedy, Christian, et al.; "Going deeper with convolutions", Proceedings of the IEEE Conference on Computer Vision and Pattern Recognition, Sep. 17, 2014, pp. 1-12.
Goodfellow, Ian J., et al.; "Generative Adversarial Nets", Advances in Neural Information Processing Systems, 2014, pp. 1-9.
Radford, Alec, et al.; "Unsupervised Representation Learning With Deep Convolutional Generative Adversarial Networks", Cornell University, Computer Science—Machine Learning, Jan. 2, 2016, pp. 1-16.
Arjovsky, Martin, et al.; "Wasserstein GAN", arXiv preprint arXiv:1701. 07875 (2017), pp. 1-32.
Mardani, Morteza, et al.; Deep Generative Adversarial Networks for Compressed Sensing (GANCS) Automates MRI, IEEE Transactions on Medical Imaging, 2017, pp. 1-12.
Heusel, Martin, et al.; "GANs Trained by a Two Time-Scale Update Rule Converge to a Local Nash Equilibrium", Advances in Neural Information Processing Systems, Jan. 12, 2018, pp. 1-38.
Karras, et al.; "Progressive Growing of Gans For Improved Quality, Stability, and Variation", Cornell University Library, Feb. 26, 2018, pp. 1-26.
Schlemper, et al.; "A Deep Cascade of Convolutional Neural Networks for Dynamic MR Image Reconstruction", IEEE Transactions on Medical Imaging, Feb. 2018, Volume: 37, Issue: 02, pp. 1-13.
Yang, G., et al.; "DAGAN: Deep De-Aliasing Generative Adversarial Networks for Fast Compressed Sensing MRI Reconstruction", IEEE Transactions on Medical Imaging, Jun. 2018; vol. 37, Issue:06, pp. 1310-1321.
Malkiel, Itzik, et al.; "Densely Connected Iterative Network for Sparse MRI Reconstruction", 2018, pp. 1-2, website: https://submissions.mirasmart.com/ISMRM2018/ViewSubmission.aspx?sbmID=5936.

* cited by examiner

98 — mseMA ← 0;
96 — ganMA ← 0;
148 — β ← initGradBalance;
for t = 0, ..., $n_{critic}$ do

Sample a minibatch of m under sampled data points $\{z^{(1)}, ..., z^{(m)}\}$ with a corresponding m fully sampled data points $\{x^{(1)}, ..., x^{(m)}\}$ from the dataset;
update the discriminator by ascending its stochastic gradient:;

150 ▸    $g_w \leftarrow \nabla_w \left[ \frac{1}{m} \frac{1}{\beta} \left( \sum_{i=1}^{m} D_w(x^{(i)}) - \sum_{i=1}^{m} D_w(G_\theta(z^{(i)})) \right) \right]$;
     $w \leftarrow w + \alpha \cdot \text{Adam}(w, g_w)$;
     $w \leftarrow \text{clip}(w, -c, c)$ Sample a minibatch of m under sampled data points $\{z^{(1)}, ..., z^{(m)}\}$ with a corresponding m fully sampled data points $\{x^{(1)}, ..., x^{(m)}\}$ from the dataset;

152 ▸    $g_\theta \leftarrow \nabla_\theta \left[ \frac{1}{m} \left( \frac{1}{\beta} \sum_{i=1}^{m} D_w(G_\theta(z^{(i)})) + \sum_{i=1}^{m} MSE(x^{(i)}, G_\theta(z^{(i)})) \right) \right]$;
     $\theta \leftarrow \theta + \alpha \cdot \text{Adam}(\theta, g_\theta)$;

154 ▸    $g_{gan} \leftarrow \frac{1}{m} \sum_{i=1}^{m} \nabla_{G_\theta(z^{(i)})} \left[ D_w(G_\theta(z^{(i)})) \right]$;
     $g_{MSE} \leftarrow \frac{1}{m} \sum_{i=1}^{m} \nabla_{G_\theta(z^{(i)})} \left[ MSE(x^{(i)}, G_\theta(z^{(i)})) \right]$;
     ganMA ← ganMA * λ + (1-λ) * STD($g_{gan}$);
     mseMA ← mseMA * λ + (1-λ) * STD($g_{MSE}$);

140 ▸ if ganMA > mseMA * ratio then — 142
156 ▸    β ← β * rate; — 144
146 ▸    ganMA ← ganMA/rate — 144

METHOD AND APPARATUS FOR USING GENERATIVE ADVERSARIAL NETWORKS IN MAGNETIC RESONANCE IMAGE RECONSTRUCTION

BACKGROUND

In general, magnetic resonance imaging (MRI) examinations are based on the interactions among a primary magnetic field, a radiofrequency (RF) magnetic field, and time varying magnetic gradient fields with gyromagnetic material having nuclear spins within a subject of interest, such as a patient. Certain gyromagnetic materials, such as hydrogen nuclei in water molecules, have characteristic behaviors in response to external magnetic fields. The precession of spins of these nuclei can be influenced by manipulation of the fields to produce RF signals that can be detected, processed, and used to reconstruct a useful image.

In general, a neural network may be used to reconstruct the images produced by an MRI system. However, some neural networks use loss functions that incorporate pixel-wise distance to learn to reconstruct the images, which may lead to blurred images. Further, although generally producing sharper images, generative adversarial networks, may, in some scenarios take longer to train, and can sometimes produce image artifacts or unrealistic images, especially when applied to smaller-sized datasets.

BRIEF DESCRIPTION

In one embodiment, a method of reconstructing imaging data into a reconstructed image may include training a generative adversarial network (GAN) to reconstruct the imaging data. The GAN may include a generator and a discriminator. Training the GAN may include determining a combined loss by adaptively adjusting an adversarial loss based at least in part on a difference between the adversarial loss and a pixel-wise loss. Additionally, the combined loss may be a combination of the adversarial loss and the pixel-wise loss. Training the GAN may also include updating the generator based at least in part on the combined loss. The method may also include receiving, into the generator, the imaging data and reconstructing, via the generator, the imaging data into a reconstructed image.

In another embodiment, a tangible, non-transitory, machine-readable medium with machine-executable instructions which, when executed by at least one processor of a machine, may cause the processor to train a generative adversarial network (GAN) to reconstruct input image data. The GAN may include a generator and a discriminator, and training of the GAN may include updating the generator based at least in part on a combined loss. Additionally, the combined loss may include a combination of an adversarial loss and a pixel-wise loss. The instructions may also cause the processor to receive, via the generator, the input image data, and reconstruct, the input image data into an output image.

In another embodiment, a method of training a generator network may include determining, over each iteration of multiple iterations, an adaptive combined loss. The adaptive combined loss may include a pixel-wise loss and an adversarial loss. Additionally, the pixel-wise loss may correspond to a direct comparison between a generated image, generated by the generator network, and a ground truth image, and the adversarial loss may correspond to an estimated comparison between the generated image and the ground truth image, as estimated by a discriminator network. The adversarial loss may be adaptively adjusted based on a ratio between the pixel-wise loss and the adversarial loss such that the ratio is below a threshold. The method may also include updating, during each iteration, the generator network based at least in part on the adaptive combined loss such that, in subsequent iterations, the updated generator network is more likely to generate a subsequent generated image that better represents a subsequent ground truth image than the generated image represented the ground truth image.

BRIEF DESCRIPTION OF THE DRAWINGS

These and other features, aspects, and advantages of the present invention will become better understood when the following detailed description is read with reference to the accompanying drawings in which like characters represent like parts throughout the drawings, wherein.

DETAILED DESCRIPTION

One or more specific embodiments will be described below. In an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," "the," and "said" are intended to mean that there are one or more of the elements. The terms "comprising," "including," and "having" are intended to be inclusive and mean that there may be additional elements other than the listed elements. Furthermore, any numerical examples in the following discussion are intended to be non-limiting, and thus additional numerical values, ranges, and percentages are within the scope of the disclosed embodiments.

In general, magnetic resonance imaging (MRI) is based on the interactions of a primary magnetic field, time varying magnetic gradient fields, and a radiofrequency (RF) field with gyromagnetic material within a subject of interest (e.g., a patient). Certain gyromagnetic materials, such as hydrogen nuclei in water molecules, have characteristic behaviors in response to external electromagnetic fields (e.g., constant or time varying electric fields, magnetic fields, or a combination thereof). The precession of spins of these nuclei can be influenced by manipulation of the fields to produce RF signals that can be detected, processed, and used to reconstruct a useful image.

Coil data from the RF signals may be under sampled and/or include artifacts or blurring, for example, due to patient motion during imaging. Furthermore, under sampled coil data may be obtained deliberately to increase the speed at which coil data may be taken and images produced. In some scenarios, quicker image capture may prove less prone to movement between subsequent coil data capture and lead to less blurring of a rendered image. Additionally, quicker image capture may also result in faster imaging procedures, which may increase efficiency and/or patient comfort. However, under sampled or artifact ridden coil data may produce inaccurate, blurred, or artifact ridden images when reconstructed. As such, it is now recognized that a need exists for a reconstruction module capable of accurately and efficiently reconstructing coil data into a displayable image.

In some embodiments, image reconstruction of coil data may be accomplished, for example, via a neural network, to provide a higher quality image (e.g., higher quality than images produced from a basic reconstruction). However, in some scenarios deep neural network reconstruction models may struggle to reconstruct sharp images with fine detail while maintaining a natural appearance. As such, in some embodiments, the neural network may be trained to identify which types of characteristics of the image are expected to be present and how to more accurately reconstruct an image from under sampled, noisy, or artifact ridden coil data.

In some embodiments, the neural network may be trained using a generative adversarial network (GAN), which, in some embodiments, may be implemented in a reconstruction module. Furthermore, the reconstruction module may be implemented, for example, via executable code (e.g., software) stored in memory of a computer, which may include one or more processors to execute the code. In general, a GAN utilizes a generator network and a discriminator network as part of a supervised machine learning algorithm. The generator network may produce a generated image from under sampled, noisy, or artifact ridden coil data to estimate a true image and the discriminator network may receive the generated image and the true image and attempt to determine which, of the generated image and the true image, is, in fact, the true image. In learning how to generate accurate image representations and determine the difference between true images and generated images, the generator network and the discriminator network may be balanced such that each learns at a similar rate as the other. In other words, the generator network may attempt to fool the discriminator network by trying to reconstruct the under sampled coil data into an image that appears real, and the discriminator network may learn, over subsequent iterations, how to better determine which image is real and which is generated by the generator network. As discussed herein, learning may refer to updating the code (e.g., updating weighting factors within the neural networks) of a neural network, implemented, for example, on a computer.

The generator network may be updated after each iteration of the learning process by the discriminator with an adversarial loss. With each update, the adversarial loss may be used by the generator network to learn how to better fool the discriminator network. However, in general, GANs may incur instabilities in training, and, when applied to small datasets (e.g., less than 50, less than 100, or less than 500 samples), may produce image artifacts (e.g., jagged edges, blurring, and/or inaccuracies), which may be undesirable in radiological settings. To assist in overcoming such instabilities, preserve fine detail, and/or maintain a natural appearance the adversarial loss may be combined with a pixel-wise loss indicative of the differences between the generated image and the true image. Such combination may be accomplished by a weighted sum and/or by adaptive loss balancing. In some embodiments, the adaptive loss balancing may help the GAN converge to higher quality generated images in fewer epochs (e.g., iterations across the entire training dataset) than with a simple weighted sum.

As set forth above, the embodiments described herein may be implemented as a part of an MRI system, wherein specific imaging routines are initiated by a user (e.g., a radiologist). Thus, the system may perform data acquisition, data reconstruction, and in certain instances, image synthesis. Accordingly, referring to FIG. 1, an imaging system 10 is illustrated schematically as including a scanner 12, scanner control circuitry 14, and system control circuitry 16.

Figure 1:
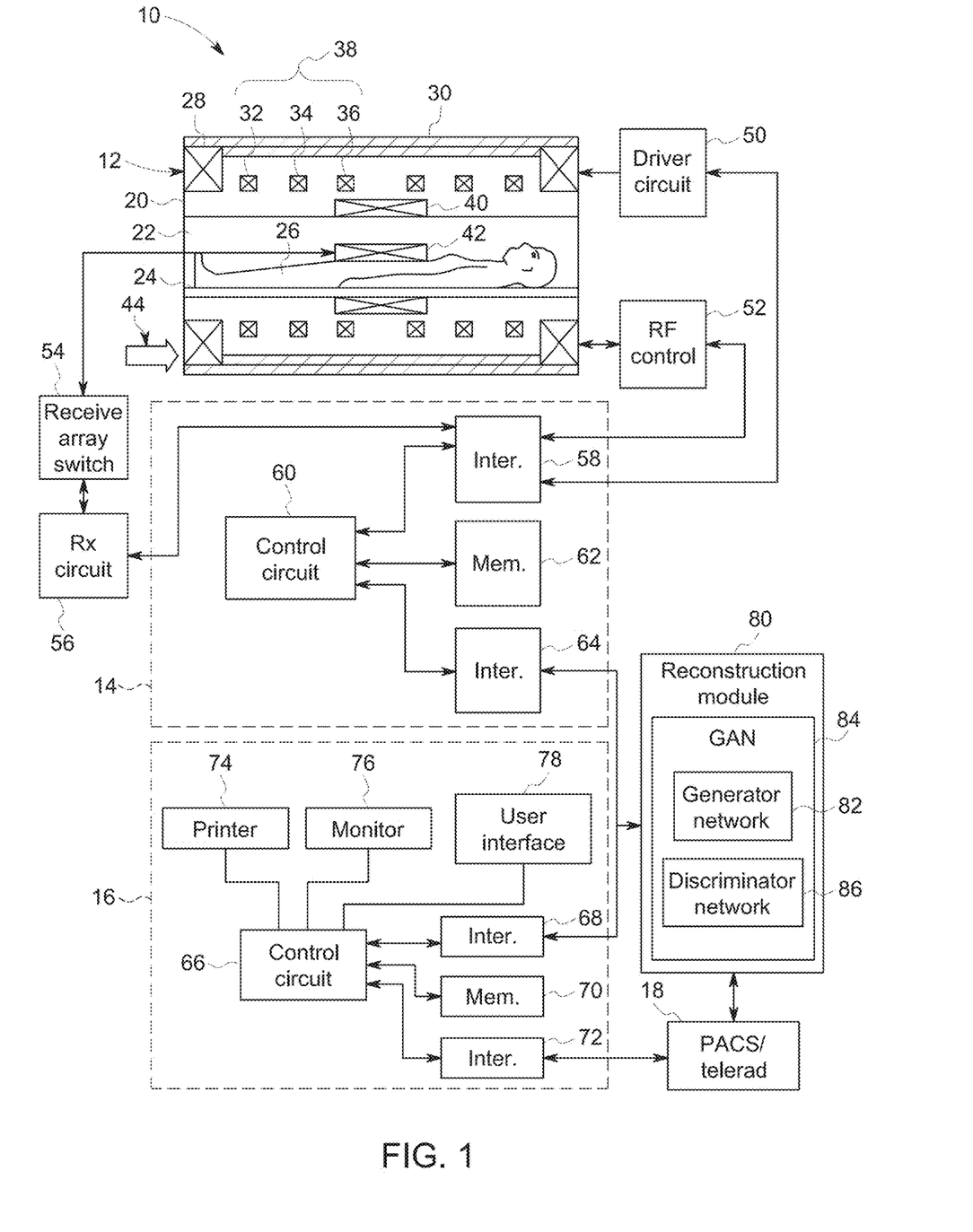
FIG. 1 illustrates a magnetic resonance imaging (MRI) system having a scanner and an image reconstruction unit, in accordance with an aspect of the present disclosure.

The imaging system 10 additionally includes remote access and storage systems 18 and/or devices such as picture archiving and communication systems (PACS), or other devices such as teleradiology equipment so that data acquired by the imaging system 10 may be accessed on- or off-site. In this way, MRI data may be acquired, followed by on- or off-site processing and evaluation. While the imaging system 10 may include any suitable scanner or detector, in the illustrated embodiment, the imaging system 10 includes a full body scanner 12 having a housing 20 through which an opening (e.g., an annular opening) is formed to accommodate a bore tube 22. The bore tube 22 may be made of any suitable material such as a non-metallic and/or non-magnetic material. A table 24 is moveable into the bore tube 22 to permit a patient 26 to be positioned therein for imaging selected anatomy within the patient. In some embodiments, the bore tube 22 may surround an entire subject or just a portion thereof (e.g., a patient's head, thorax, or extremity). In some embodiments, the bore tube 22 may support the table 24 and/or articulation components (e.g., a motor, pulley, and/or slides).

The scanner 12 may include a series of associated conductive coils for producing controlled electromagnetic fields for exciting the gyromagnetic material within the anatomy of the subject being imaged. Specifically, primary magnet coils 28 are provided for generating a primary magnetic field, which is generally aligned with the bore tube 22. The primary magnetic coils 28 may be made of a superconductor, which during operation, may generate the primary magnetic field to strengths greater than 1 Tesla. A coil support structure 30 may support the primary magnetic coils 28 and maintain their position within the scanner 12 under the forces sustained during operation.

A series of gradient coils 32, 34, and 36 (collectively 38) permit controlled magnetic gradient fields to be generated for positional encoding of certain of the gyromagnetic nuclei within the patient 26 during examination sequences. Additionally, an RF coil 40 may generate radio frequency pulses for exciting the certain gyromagnetic nuclei within the patient 26. In addition to the coils that may be local to the scanner 12, the imaging system 10 may also include a set of receiving coils 42 (e.g., an array of coils) to be placed proximal to (e.g., against) the patient 26. As an example, the receiving coils 42 can include cervical/thoracic/lumbar (CTL) coils, head coils, single-sided spine coils, and so forth. Generally, the receiving coils 42 are placed close to or on top of the patient 26 so as to receive the weak RF signals (e.g., weak relative to the transmitted pulses generated by the scanner coils) that are generated by certain of the gyromagnetic nuclei within the patient 26 as they return to their relaxed state. In some embodiments, the RF coils 40 may both transmit and receive RF signals accomplishing the role of the receiving coils 42.

The various coils of the imaging system 10 may be situated within the housing 20 of the scanner 12, and are controlled by external circuitry to generate the desired field and pulses, and to read emissions from the gyromagnetic material in a controlled manner. In the illustrated embodiment, a main power supply 44 provides power to the primary magnetic coils 28 to generate the primary magnetic field. A driver circuit 50 may include amplification and control circuitry for supplying current to the coils as defined by digitized pulse sequences output by the scanner control circuitry 14.

An RF control circuit 52 is provided for regulating operation of the RF coil 40. The RF control circuit 52 includes a switching device for alternating between the active and inactive modes of operation, wherein the RF coil 40 transmits and does not transmit signals, respectively. The RF control circuit 52 may also include amplification circuitry to generate the RF pulses. Similarly, the receiving coils 42, or RF coils 40 if no separate receiving coils 42 are implemented, are connected to a switch 54, which is capable of switching the receiving coils 42 between receiving and non-receiving modes. Thus, the receiving coils 42 may resonate with the RF signals produced by relaxing gyromagnetic nuclei from within the patient 26 while in the receiving mode, and avoid resonating with RF signals while in the non-receiving mode. Additionally, a receiving circuit 56 may receive the data detected by the receiving coils 42 and may include one or more multiplexing and/or amplification circuits.

It should be noted that while the scanner 12 and the control/amplification circuitry described above are illustrated as being connected by single lines, one or more cables or connectors may be used depending on implementation. For example, separate lines may be used for control, data communication, power transmission, and so on. Further, suitable hardware may be disposed along each type of line for the proper handling of the data and current/voltage. Indeed, various filters, digitizers, and processors may be disposed between the scanner 12 and the scanner control circuitry 14 and/or system control circuitry 16.

As illustrated, the scanner control circuitry 14 includes an interface circuit 58, which outputs signals for driving the gradient field coils 38 and the RF coil 40 and for receiving the data representative of the magnetic resonance signals produced in examination sequences. The interface circuit 58 may be connected to a control and analysis circuit 60. The control and analysis circuit 60 executes the commands to the driver circuit 50 and the RF control circuit 52 based on defined protocols selected via system control circuitry 16.

The control and analysis circuit 60 may also serve to receive the magnetic resonance signals and perform subsequent processing before transmitting the data to system control circuitry 16. Scanner control circuitry 14 may also include one or more memory circuits 62, which store configuration parameters, pulse sequence descriptions, examination results, and so forth, during operation.

A second interface circuit 64 may connect the control and analysis circuit 60 to a system control circuit 66 for exchanging data between scanner control circuitry 14 and system control circuitry 16. The system control circuitry 16 may include a third interface circuit 68, which receives data from the scanner control circuitry 14 and transmits data and commands back to the scanner control circuitry 14. As with the control and analysis circuit 60, the system control circuit 66 may include a computer processing unit (CPU) in a multi-purpose or application specific computer or workstation. System control circuit 66 may include or be connected to a second memory circuit 70 to store programming code for operation of the imaging system 10 and to store the processed coil data for later reconstruction, display and transmission. The programming code may execute one or more algorithms that, when executed by a processor, are configured to perform reconstruction of acquired data.

An additional input output (I/O) interface 72 may be provided for exchanging coil data, configuration parameters, and so forth with external system components such as remote access and storage systems 18. Finally, the system control circuit 66 may be communicatively coupled to various peripheral devices for facilitating an operator interface and for producing hard copies of the reconstructed images. In the illustrated embodiment, these peripherals include a printer 74, a monitor 76, and a user interface 78 including, for example, devices such as a keyboard, a mouse, a touchscreen (e.g., integrated with the monitor 76), and so forth.

In some embodiments, a reconstruction module 80 may be implemented to reconstruct coil data into a viewable image. As discussed above, in some embodiments, image reconstruction of coil data may be accomplished, for example, via a neural network to provide a sharper and more detailed image than would be produced from a basic reconstruction. As such, the reconstruction module 80 may include a generator network 82 (e.g., a convolutional neural network) to estimate a fully sampled image from under sampled coil data with minimal artifacts or blurring. Furthermore, the reconstruction module 80 may be implemented as software to be executed by one or more processors of a computer system. Additionally or alternatively, the reconstruction module may include a computer, including memory and one or more processors, on which software modules may be run.

In some embodiments, the reconstruction module 80 may include a GAN 84 to teach the generator network 82 characteristics of real images in the subject matter of interest. For example, the generator network 82 may be trained to expect certain image features (e.g., pictorial representations of the subject of an MRI scan) and interpolate the noisy or under sampled coil data to provide an estimation of a fully sampled image. As such, the generator network 82 may be conditioned to expect certain elements in the coil data and learn how to more accurately reconstruct an image from under sampled, noisy, or artifact ridden coil data.

To help teach the generator network 82 the GAN 84 may also include a discriminator network 86 (e.g., a convolutional neural network). The generator network 82 and the discriminator network 86 may teach each other as part of a supervised machine learning algorithm. As should be appreciated, the reconstruction module 80, the generator network 82, and/or the discriminator network 86 may be integrated, at least partially, into the imaging system 10 (e.g., in the scanner control circuitry 14, system control circuitry, and/or remote access and storage systems 18) or be implemented separately from the imaging system 10, for example, as part of stand-alone software or a stand-alone computer. For example, the reconstruction module 80 may receive coil data from an interface circuit 58, 64, 68, 72 of the scanner control circuitry 14 or the system control circuitry 16 or the storage system 18 such as PACS, and the generator network 82 of the reconstruction module 80 may reconstruct an image of the scanned subject (e.g., the patient 26). Additionally, reconstructed images may be sent, for example, to the storage system 18 and/or to the monitor 76 for viewing. Moreover, in some embodiments, the generator network 82 of the GAN 84 may be trained with the discriminator network 86, and implemented separately from the discriminator network 86 for use with the imaging system 10. For example, the generator network 82 may be trained with use of a GAN 84 and subsequently transferred to and implemented by memory of a reconstruction module.

Figure 2:
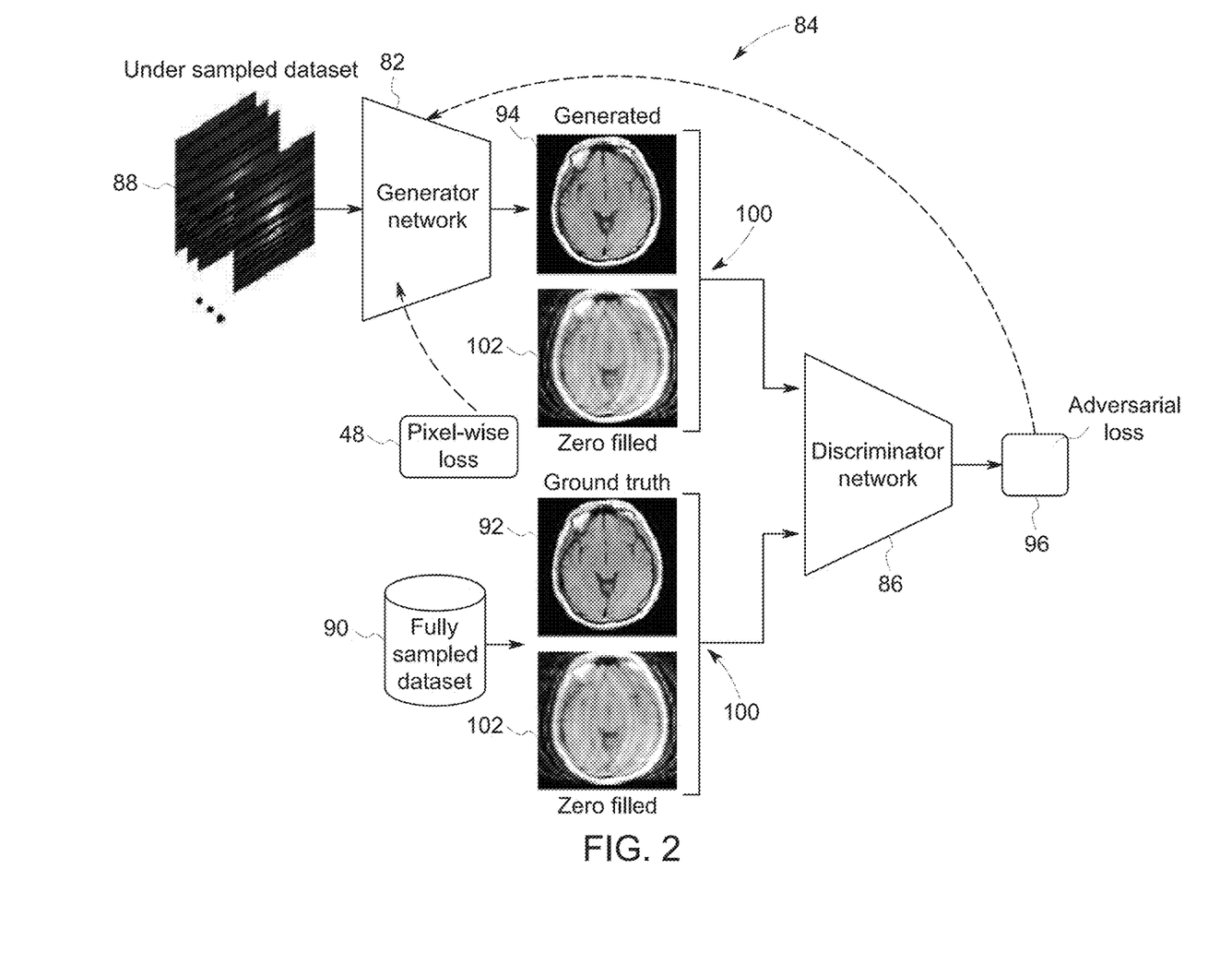
FIG. 2 is a schematic diagram of a neural network architecture for use in image reconstruction, in accordance with an aspect of the present disclosure.

FIG. 2 is a schematic diagram of the neural network architecture of the GAN 84 for use in training the generator network 82 to produce improved (e.g., relative to basic reconstructions) reconstructed images. During training, the GAN 84 may receive data from an under sampled dataset 88 and a fully sampled dataset 90. The under sampled dataset 88 and fully sampled dataset 90 may stem from a common group of training images, such that each under sampled image corresponds to a fully sampled image. The training images may be derived from, for example, coil data from the storage system 18, the scanner control circuitry 14, and/or the system control circuitry 16. The under sampled dataset 88 may correspond to or be indicative of data produced from the scanner 12 such as coil data. For example, the under sampled dataset 88 may be similar to under sampled coil data desired to be reconstructed that does not already have a fully sampled counterpart. Additionally, the fully sampled dataset 90 may have associated ground truth images 92 which may be of high fidelity (e.g., minimal or no artifacts or blurring) and natural in appearance. Moreover, the ground truth images 92 may be indicative of radiological images at the high fidelity that the generator network 82 is trying to replicate from the under sampled dataset 88.

In one embodiment, the generator network 82 of the GAN 84 may receive an under sampled image, or coil data indicative thereof, from the under sampled dataset 88 and produce a generated image 94 therefrom. In some embodiments, the under sampled image may be zero filled (e.g., missing or unavailable sections of data may be written as logical zeros). Subsequently, the discriminator network 86 may approximate an earth mover's distance (EMD) or other suitable metric between the generated image 94 and the ground truth image 92 and estimate which of the images is indeed the ground truth image 92. The EMD may represent a measure of the distance between two probability distributions over a region or space. From the EMD estimation, a loss function, for example an adversarial loss 96, may be generated and fed back into the generator network 82. Additionally, in some embodiments, a pixel-wise loss 98 may be produced and combined with the adversarial loss 96 to further the training of the generator network 82 toward production of realistic and high fidelity images. As should be appreciated, the adversarial loss 96 and/or pixel-wise loss 98 may be determined by the generator network 82, the discriminator network, or exterior to the networks, such as by a training monitor portion of the GAN 84. Further, the discriminator network 86 may be updated, for example based on the adversarial loss or a discriminator loss, such that, in subsequent iterations, the discriminator network 86 may better estimate the EMD between the generated image 94 and the ground truth image 92 and, thus, more accurately determine which image is, in fact, the ground truth image 92.

Furthermore, the GAN 84 may be any suitable type of GAN, such as a Wasserstein GAN (WGAN), a conditional GAN (cGAN), or a combination thereof (e.g., a conditional Wasserstein GAN (cWGAN)). As illustrated, in some embodiments, the GAN 84 may be a conditional generative adversarial network (cGAN). When implemented as a cGAN, pairs of images 100, or a set of any suitable number of images, may be supplied to the discriminator network 86 for evaluation. For example, the generator network 82 may provide the generated image 94 and a conditioning image 102 to the discriminator network 86. Likewise, the ground truth image 92 may also be accompanied by a conditioning image 102. In some embodiments, when the discriminator network 86 receives pairs of images 100 (e.g., with a conditioning image 102) the discriminator network 86 is able to enforce a higher data fidelity compared to that of a non-conditional GAN. For example, the use of a conditioning image 102 may lead to perceptually better image appearance due to the discriminator network's ability to match a specific image (e.g., the conditioning image 102) to the generated image 94 instead of general perceptual properties of the entire dataset (e.g., the fully sampled dataset 90 and/or the under sampled dataset 88). Furthermore, in some embodiments, multiple generated images 94 or pairs of images 100 may be sent in a batch to the discriminator network 86 during a single step of the training loop. For example, the generator network 82 may receive ten under sampled images from the under sampled dataset 88, generate ten corresponding images, and the discriminator network may then estimate a score for each image, or pair of images 100, separately, before the generator network 82 and/or the discriminator network 86 is updated.

Additionally, the generator network 82 may be any suitable type of image reconstruction network. For example, the generator network 82 may reconstruct images based on under sampled coil data and be or include a deep learning-based network, a sparse reconstruction network, and/or a convolutional neural network. In some embodiments, the generator network 82 may be a densely connected iterative network (DCI network). Further, in some embodiments, the DCI network may include dense connections across multiple network layers, which may strengthen feature propagation. Moreover, the DCI network may include a relatively deep architecture with multiple convolution layers (e.g., greater than 10, greater than 50, greater than 100, and so on) facilitating increased capacity. Furthermore, the discriminator network 86 may be any suitable type of discriminator network for use in GAN training. For example, the discriminator network 86 may be a convolutional network.

As discussed above, to update the generator network 82 and/or the discriminator network 86, the adversarial loss 96 may be created based on the discriminator network's estimation of the EMD between the generated image 94 and the ground truth image 92. As each network (e.g., the generator network 82 and the discriminator network 86) is updated, each network is trained against the other. For example, EQ. 1 illustrates an example GAN objective function, $$\mathcal{L}_{cWGAN}(G,D) = \mathbb{E}_{x,y}[D(x,y)] - \mathbb{E}_x[D(x,G(x))], \qquad \text{EQ. 1}$$

where $\mathbb{E}$ is the expected value, G is a function of the generator network 82, D is a function of the discriminator network 86, x is the under sampled image, and y is the ground truth image. While the generator network 82 tries to minimize EQ. 1, the discriminator network 86 tries to maximize it, and, in some embodiments, the adversarial loss 96 may be given by the residual, for example, as in EQ. 2, $$\arg\min_G\max_D \mathcal{L}_{cWGAN} WGAN(G, D). \qquad \text{EQ. 2}$$

Upon iteration of the training cycle, the generator network 82 may be trained how to trick the discriminator network 86 into determining that the generated image 94 is the ground truth image 92. As such, the adversarial loss 96 may dynamically change during training from one iteration to the next. Simultaneously, throughout the iterations, the discriminator network 86 may learn how to better decipher which of the generated images 94 and the ground truth images 92 are, in fact, ground truth images 92. However, in some scenarios, updating the GAN 84 based on just the adversarial loss 96 may lead to training instabilities. For example, the dynamically changing adversarial loss 96 may generate gradients with a variable norm. Therefore, the supervised machine learning process may deviate away from the ground truth images 92 spatially and, thus deviate from realistic looking images even while reducing the EMD estimated by the discriminator network 86. As such, the training of the GAN 84 may result in perceivable artifacts appearing in the generated images 94. To provide for more accurate generated images, the adversarial loss 96 and pixel-wise loss 98 may be combined, for example via a weighted sum, to update the generator network 82 such that subsequent iterations of image generation have a higher likelihood of reducing the EMD estimated by the discriminator network 86 and producing more realistic and higher quality images.

The pixel-wise loss 98 may include any suitable metric for directly comparing the generated image 94 and the ground truth image 92. For example, the pixel-wise loss 98 may correspond to a mean-square-error (MSE) between the generated image 94 and the ground truth image 92, for example, as given in EQ. 3, $$\mathcal{L}_{MSE}(G) = \frac{1}{WH}\sum_{i=1}^{W}\sum_{j=1}^{H}(y_{i,j} - G(x)_{i,j})^2, \qquad \text{EQ. 3}$$

where W and H are the pixel width and pixel height of the images, respectively, and i and j are counting indices.

In some embodiments, the combination of the adversarial loss 96 and the pixel-wise loss 98 may include a weighted sum, for example, as shown in EQ. 4, $$\mathcal{L}_G = \arg\min_G\max_D \mathcal{L}_{cWGAN} WGAN(G, D) + \lambda \mathcal{L}_{MSE}(G), \qquad \text{EQ. 4}$$

where $\lambda$ is a weighting factor or function. The combined adversarial loss 96 and pixel-wise loss 98 may update the generator network 82 such that subsequent iterations of image generation have a higher likelihood of reducing the EMD estimated by the discriminator network 86 (e.g., from the adversarial loss 96) and producing a higher quality image that maintains the realism of the ground truth images 92 (e.g., via the pixel-wise loss 98).

In some scenarios, a simple weighted sum may, eventually (e.g., over the training iterations), lead to a divergence between the adversarial loss 96 and the pixel-wise loss 98. Further, the divergent losses may lead to instabilities in training of the GAN 84. For example, the standard deviation of the adversarial loss 96, or gradient thereof, may become one or more orders of magnitude greater than the pixel-wise loss 98, or gradient thereof, which may cause the training of the GAN 84 to drift spatially away from the ground truth. As such, in one embodiment, the combined adversarial loss 96 and pixel-wise loss 98 may be adaptively weighted, for example, to maintain a moving average of the standard deviation of the gradients (MASDG) of the adversarial loss 96 less than a multiple (e.g., 0.5 times, 1 times, 5 times, 10 times, 50 times, 100 times, and so on depending on implementation) of the MASDG of the pixel-wise loss 98. In one embodiment, the adversarial loss 96 may be reduced (e.g., divided) by a rate parameter, for example, via the reconstruction module 80. Moreover, in some embodiments, the rate parameter may change or be adapted to each iteration of the GAN training, depending on the ratio between the adversarial loss 96 and the pixel-wise loss 98. By maintaining the ratio of the MASDG of the adversarial loss to the MASDG of the pixel-wise loss 98 less than a threshold (e.g. 0.5, 1, 5, 10, 100), the training of the GAN 84 may be further stabilized and avoid drifting away from the ground-truth spatial information.

Additionally, in some scenarios, the reduction of the adversarial loss 96 (e.g., relative to a previous value) may lead to the discriminator network 86 learning faster than the generator network 82, for example, due to the damped adversarial loss 96 supplied to the generator network 82. As such, an adaptive loss balancing variable may be used by the GAN 84 to decay the loss updating the discriminator network 86, for example, by the same or substantially the same (e.g., within 1 order of magnitude) rate parameter as the adversarial loss 96. As such, the learning rate of the generator network 82 and discriminator network 86 may be approximately equal.

Figure 3:
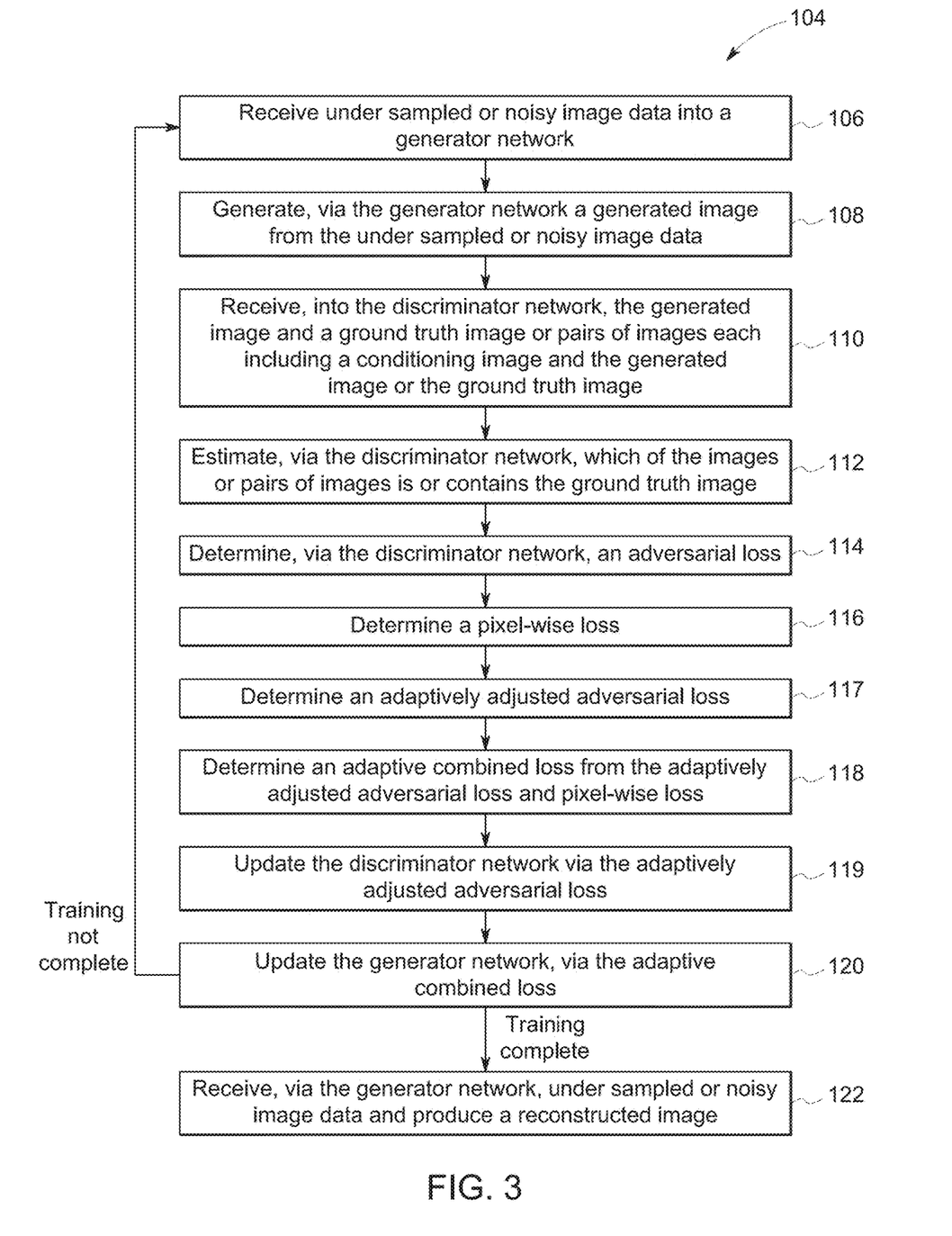
FIG. 3 is a flowchart of an example process for training a generative adversarial network (GAN) and reconstructing an image, in accordance with an aspect of the present disclosure.

FIG. 3 is a flowchart of an example process 104, implemented, for example, by the GAN 84, for training the GAN 84 and reconstructing an image. In some embodiments, the generator network 82 may receive under sampled or noisy image data (e.g., from the under sampled dataset 88) (process block 106), and generate the generated image 94 from the under sampled or noisy image data (process block 108). Additionally, the discriminator network 86 may receive the generated image 94 and the ground truth image 92 or pairs of images 100, each including the conditioning image 102 (e.g., a zero filled conditioning) and the generated image 94 or the ground truth image 92 (process block 110). The discriminator network 86 may estimate which of the images or sets of images is or contains the ground truth image 92 (process block 112). Additionally, the discriminator network 86 or other portion of the GAN 84 may determine the adversarial loss 96 (process block 114). Moreover, the pixel-wise loss 98 may also be determined (process block 116) by a portion of the GAN 84, and an adaptively adjusted adversarial loss 96 may be determined, for example, from the pre-adjusted adversarial loss 96 (process block 117). Additionally, an adaptive combined loss may be determined from the adaptively adjusted adversarial loss 96 and the pixel-wise loss 98 (process block 118), for example, via the generator network 82, discriminator network 86, a training monitor portion of the GAN 84, or a combination thereof.

The discriminator network 86 may be updated based at least in part on the adaptively adjusted adversarial loss 96 (process block 119), and the generator network 82 may be updated based at least in part on the adaptive combined loss (process block 120). If the training is not complete, the process 104 may undergo multiple iterations. Further, if the training is complete, the generator network 82 may then be given under sampled or noisy image data and produce a reconstructed image (process block 122).

Figure 4:
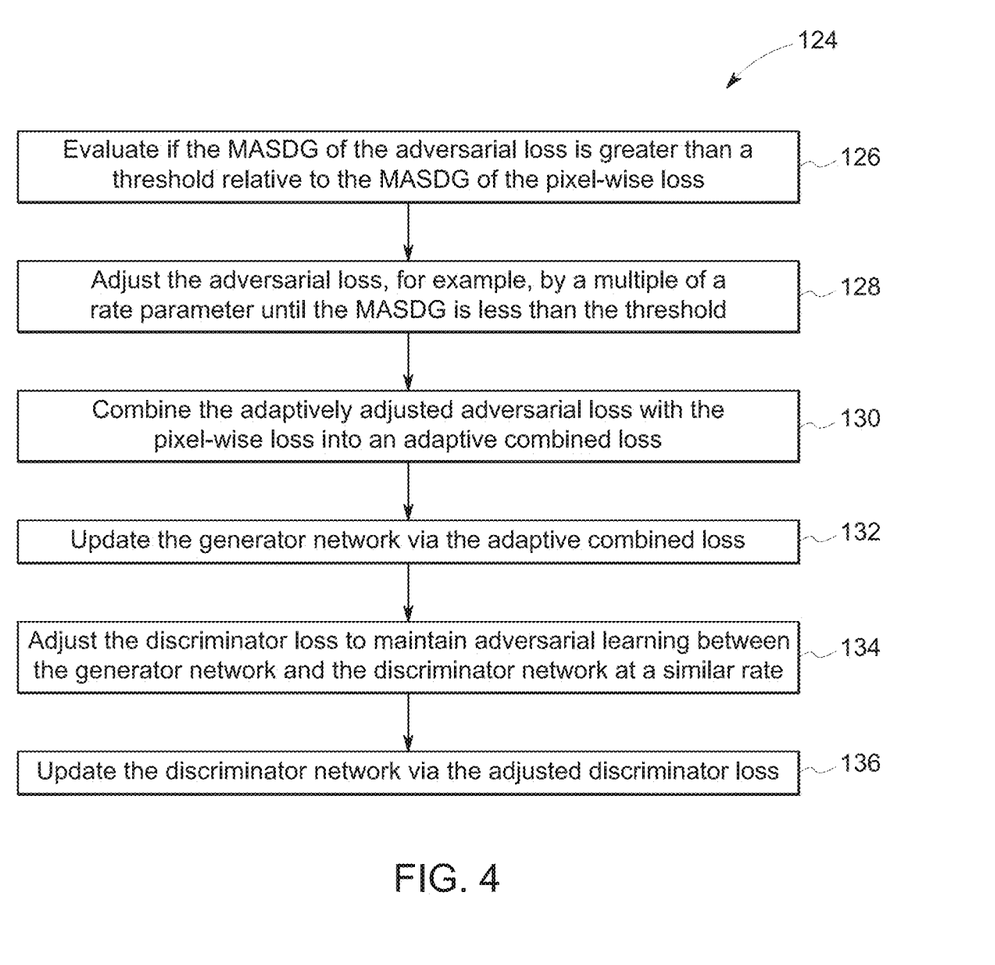
FIG. 4 is a flowchart of an example process for determining an adaptive combined loss from an adversarial loss and a pixel-wise loss, and implementing the adaptive combined loss in GAN training, in accordance with an aspect of the present disclosure.

FIG. 4 is flowchart of an example process 124, implemented, for example, by the GAN 84, for determining the adaptive combined loss from the adversarial loss 96 and the pixel-wise loss 98, and implementing the adaptive combined loss in training. The adversarial loss 96 may be evaluated to determine if the MASDG of the adversarial loss 96 is greater than a threshold relative to the MASDG of the pixel-wise loss 98 (process block 126). As discussed above, in some embodiments, the threshold may be a multiple of the MASDG of the pixel-wise loss 98. The adversarial loss 96 may then be adaptively adjusted (e.g., reduced), for example, by a multiple of a rate parameter until the MASDG of the adversarial loss 96 is less than the threshold (process block 128). The adaptively adjusted adversarial loss 96 and the pixel-wise loss 98 may then be combined into an adaptive combined loss (process block 130), for example, via a weighed sum. The generator network may then be updated via the adaptive combined loss (process block 132). Additionally, a discriminator loss, generated, for example, via the discriminator network 86 or a training monitor portion of the GAN 84 to update the discriminator network 86, may be adjusted to maintain adversarial learning between the generator network and the discriminator network at a similar rate (process block 134), for example, by reducing the discriminator loss by the rate parameter, and the discriminator network 86 may then be updated via the adjusted discriminator loss (process block 136). In some embodiments, the discriminator loss may be one-and-the-same with the adversarial loss 96. As such, the discriminator network 86 may be updated based on the adaptively adjusted adversarial loss 96.

Figure 5:
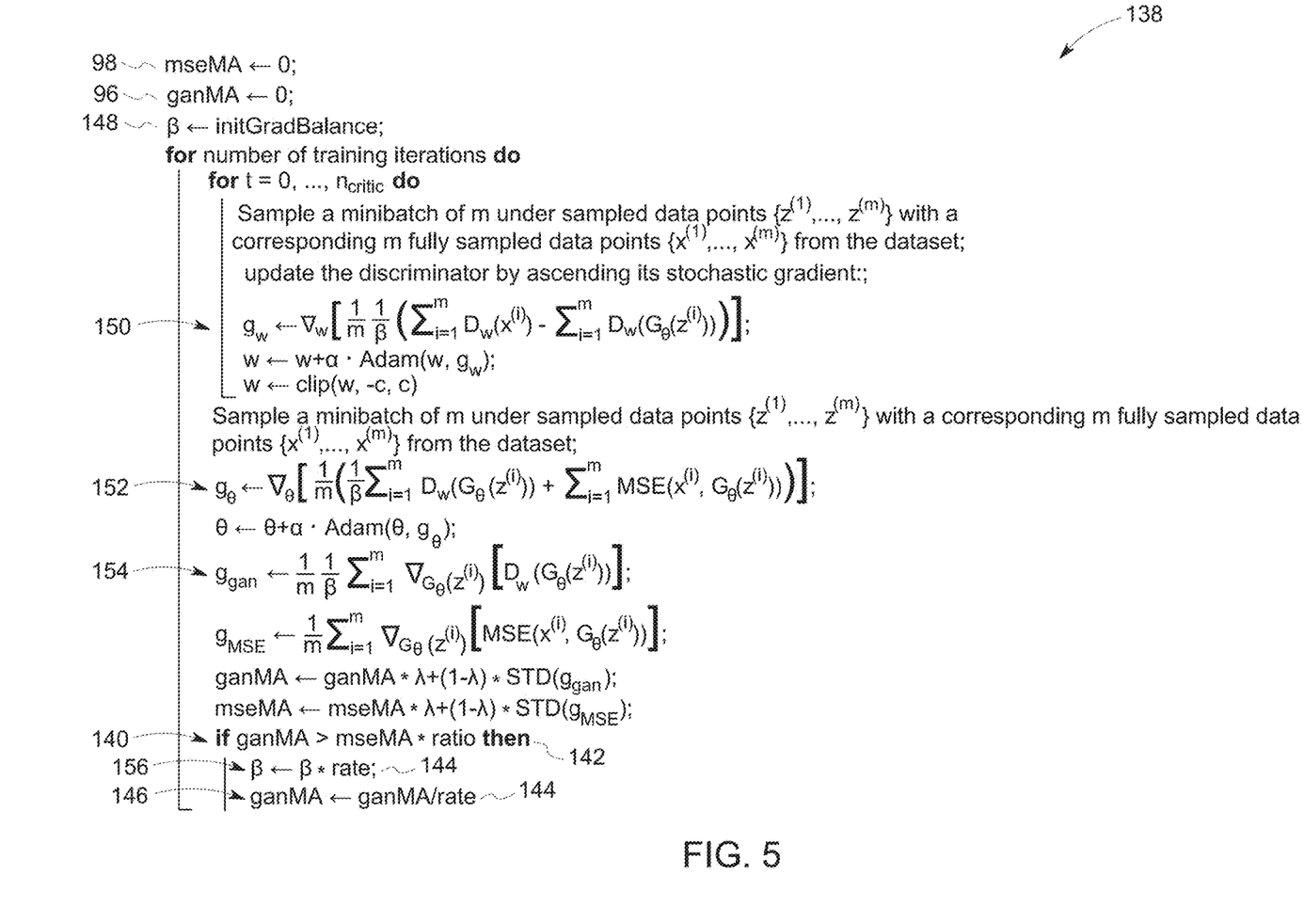
FIG. 5 is an example pseudocode depicting the adjustment to the adversarial loss, in accordance with an aspect of the present disclosure.

FIG. 5 is an example pseudocode 138 used, for example, by the reconstruction module 80, to adjust the adversarial loss 96. As discussed above, in some embodiments, the MASDG of the adversarial loss 96 may be evaluated against a factor of the MASDG of the pixel-wise loss 98, as shown in the pseudocode line 140. If the MASDG of the adversarial loss 96 is greater than the threshold (e.g., the MASDG of the pixel-wise loss 98 multiplied by a threshold ratio 142 of the MASDG of the adversarial loss 96 to the MASDG of the pixel-wise loss 98), then the MASDG of the adversarial loss 96 may be adjusted by being reduced by a rate parameter 144, as shown in the pseudocode line 146.

Additionally, in some embodiments, the adaptive loss balancing variable 148 may be implemented to reduce the discriminator loss, and, thus, equalize the rates of learning of the discriminator network 86 and the generator network 82, as shown in the pseudocode lines 150, 152, 154. Moreover, the adaptive loss balancing variable 148 may be adjusted dynamically based on the adjustment to the adversarial loss 96 at the same rate or via a proportional rate parameter 144, as shown in the pseudocode line 156.

Figure 6:
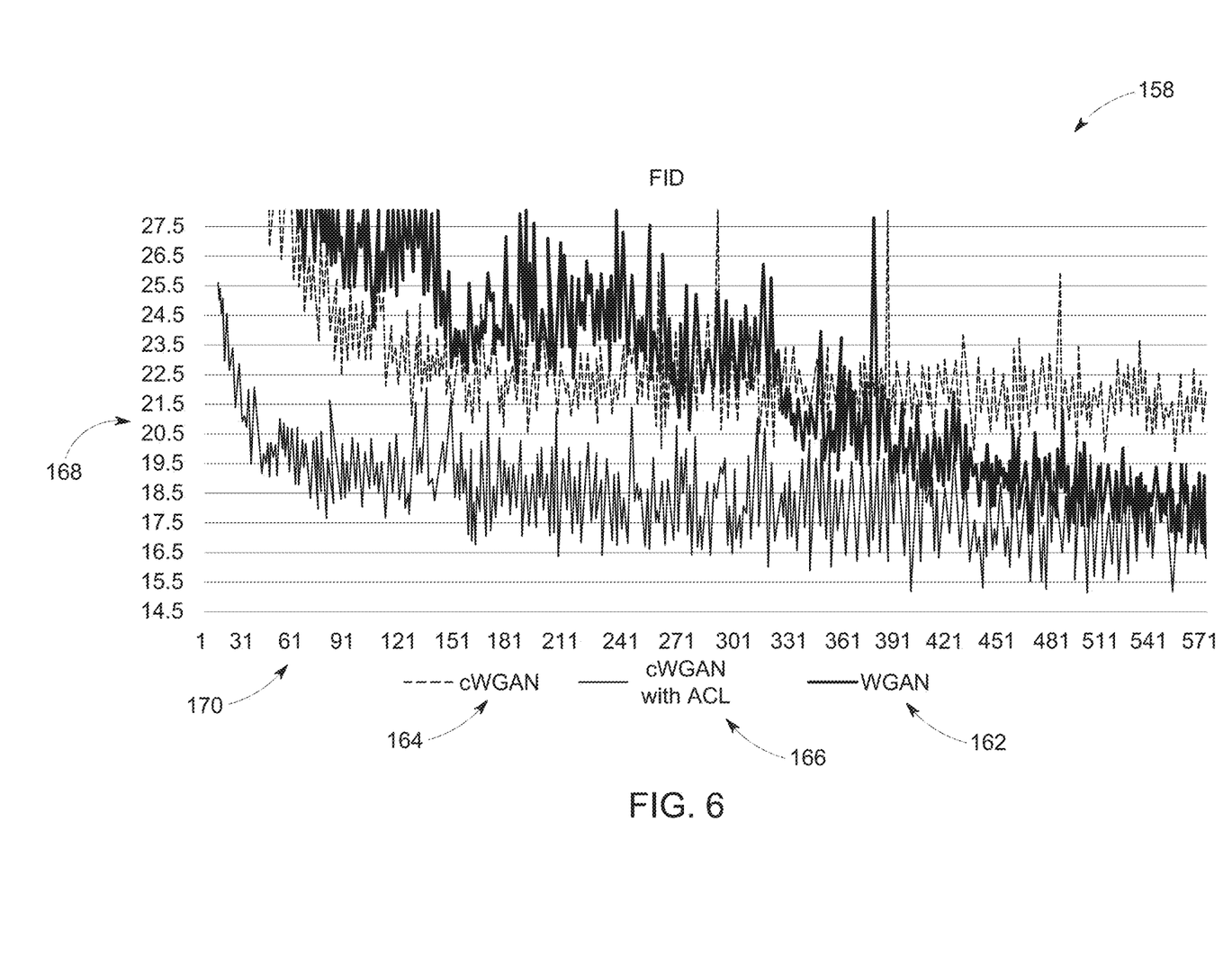
FIG. 6 is a Frèchet Inception Distance comparison during training, as shown on a validation dataset, of different implementations of GANs utilizing a WGAN, a cWGAN, and a cWGAN with an adaptive combined loss, in accordance with an aspect of the present disclosure.
Figure 7:
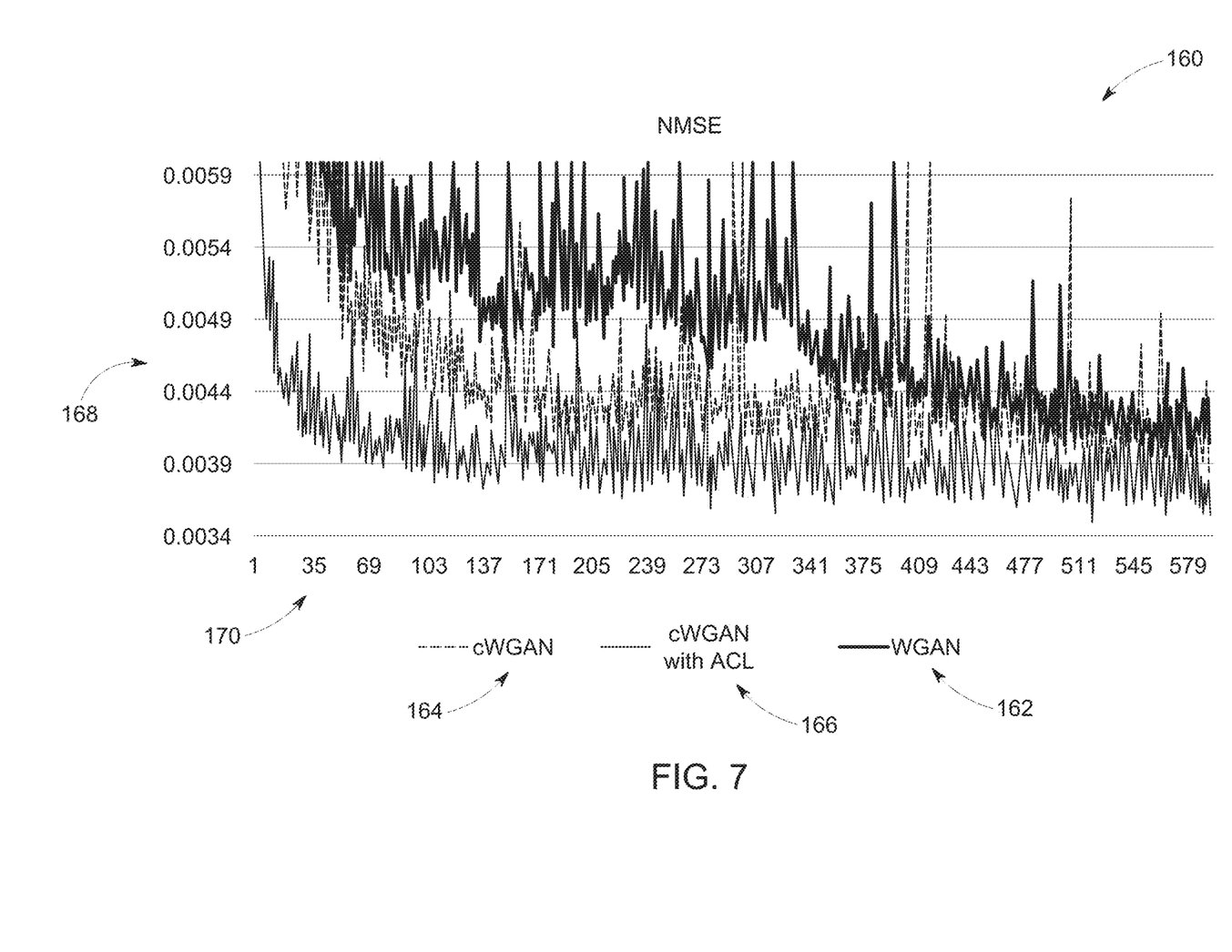
FIG. 7 is a Normalized Mean Square Error comparison during training, as shown on a validation dataset, of different implementations of GANs utilizing a WGAN, a cWGAN, and a cWGAN with an adaptive combined loss, in accordance with an aspect of the present disclosure.

FIGS. 6 and 7 depict Frèchet Inception Distance (FID) 158 and Normalized Mean Square Error (NMSE) 160 comparisons, respectively, of different implementations of GANs 84 utilizing a WGAN 162, a cWGAN 164, and a cWGAN with an adaptive combined loss (ACL) 166 to compare the effectiveness and efficiency of different GANs 84. The y-axis 168 represents the respective metric of the FID 158 and NMSE 160 comparisons, and the x-axis 170 represents the number of learning epochs completed by the respective GANs 84. As depicted, in both the FID 158 and NMSE 160 comparisons the cWGAN with ACL 166 converges to a solution with less error and does so faster than the WGAN 162 or the cWGAN 164 without the ACL. As such, by implementing an adaptive combined loss, the GAN 84 may be able to train a generator network 82 to accurately reconstruct coil data into sharp, realistic, and high quality images. Moreover, the training of the generator network 82 may converge to produce better images faster (e.g., in less iterations) than other types of GANs 84.

As should be appreciated, the adversarial loss 96, the pixel-wise loss 98, and/or the adjustments thereto or combinations thereof discussed herein may represent measurements, such as EMD or MSE, gradients or sums of the measurements, and/or standard deviations of the measurements or gradients, such as the MASDG. Additionally, although stated herein as generally applying to the reconstruction of under sampled magnetic resonance coil data, as should be appreciated, the techniques described herein such as the use of an adaptive combined loss may be utilized in the training of any suitable GAN, for construction or reconstruction of image data such as medical image data (e.g., computerized tomography (CT) image reconstruction) and/or non-medical image data. Furthermore, although the above referenced flowcharts of the processes 104, 124 are shown in a given order, in certain embodiments, the depicted steps may be reordered, altered, deleted, and/or occur simultaneously. Additionally, the referenced flowcharts of the processes 104, 124 are given as illustrative tools, and further decision and/or process blocks may be added depending on implementation.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. A method of reconstructing imaging data into a reconstructed image comprising:
   training a generative adversarial network (GAN) to reconstruct the imaging data, wherein the GAN comprises a generator and a discriminator, and wherein training the GAN comprises:
      determining a combined loss by adaptively adjusting an adversarial loss based at least in part on a ratio between the adversarial loss and a pixel-wise loss, wherein the combined loss comprises a combination of the adversarial loss and the pixel-wise loss; and
      updating the generator based at least in part on the combined loss;
   receiving, into the generator, the imaging data; and
   reconstructing, via the generator, the imaging data into the reconstructed image;
   wherein the combined loss is adaptively weighted to maintain a moving average of the standard deviation of the gradients (MASDG) of the adversarial loss less than a multiple of the MASDG of the pixel-wise loss.

2. The method of claim 1, wherein training the GAN comprises:
receiving, into the generator of the GAN, first image data corresponding to a first true image;
generating, via the generator, a first generated image based, at least in part, on the first image data, wherein the first generated image estimates the first true image;
producing, via the discriminator of the GAN, a first comparison between the first generated image and the first true image;
determining, via the GAN, the adversarial loss based at least in part on the first comparison; and
determining, via the GAN, the pixel-wise loss corresponding to a second comparison between the first generated image and the first true image.

3. The method of claim 2, wherein the generator is updated based, at least in part, on the combined loss such that the updated generator is more likely, than a previous iteration, to generate a second generated image based, at least in part, on second image data, corresponding to a second true image, with less error between the second generated image and the second true image than between the first generated image and the first true image.

4. The method of claim 2, wherein producing the first comparison between the first generated image and the first true image comprises comparing a first pair of images with a second pair of images, wherein the first pair of images comprises the first generated image and a first conditioning image and the second pair of images comprises the first true image and a second conditioning image.

5. The method of claim 4, wherein the first conditioning image, the second conditioning image, or both are zero filled images.

6. The method of claim 1, wherein the imaging data corresponds to scanned image data of a subject of a magnetic resonance imaging system, and wherein the reconstructed image is indicative of a scan of the subject.

7. The method of claim 1, wherein the imaging data comprises under sampled image data.

8. The method of claim 1, wherein adaptively adjusting the adversarial loss comprises reducing the adversarial loss such that the ratio is below a threshold.

9. The method of claim 1, wherein the combined loss comprises a weighted sum of the adversarial loss and the pixel-wise loss.

10. The method of claim 1, wherein training the GAN further comprises:
determining a discriminator loss to update the discriminator;
adaptively adjusting the discriminator loss based at least in part on the ratio between the adversarial loss and the pixel-wise loss; and
updating the discriminator based, at least in part, on the adjusted discriminator loss.

11. The method of claim 10, wherein the combined loss and the discriminator loss are adaptively adjusted based, at least in part, on a rate factor, wherein the rate factor is based, at least in part, on the ratio.

12. The method of claim 1, wherein the GAN is a conditional Wasserstein generative adversarial network (cWGAN).

13. The method of claim 1, wherein the adversarial loss corresponds to an Earth Mover's Distance (EMD) between a generated image of the generator and a true image to which the generated image corresponds.

14. The method of claim 1, wherein the pixel-wise loss corresponds to a Mean Square Error (MSE) between a generated image of the generator and a true image to which the generated image corresponds.

15. A tangible, non-transitory, machine-readable medium comprising machine-executable instructions which, when executed by at least one processor of a machine, cause the at least one processor to:
train a generative adversarial network (GAN) to reconstruct input image data, wherein the GAN comprises a generator and a discriminator, and wherein training the GAN comprises:
determining a combined loss by adaptively adjusting an adversarial loss based at least in part on a ratio between the adversarial loss and a pixel-wise loss, wherein the combined loss comprises a combination of the adversarial loss and the pixel-wise loss; and
updating the generator based at least in part on the combined loss;
receive, into the generator, the input image data;
reconstruct, via the generator, the input image data into an output image; and wherein the combined loss is adaptively weighted to maintain a moving average of the standard deviation of the gradients (MASDG) of the adversarial loss less than a multiple of the MASDG of the pixel-wise loss.

16. The machine-readable medium of claim 15, wherein, when executed by the at least one processor of the machine, cause the at least one processor to:
receive, into the generator, first image data corresponding to a first true image;
generate, via the generator, a first generated image from the first image data, wherein the first generated image estimates the first true image;
produce, via the discriminator, a first comparison between the first generated image and the first true image, wherein production of the first comparison comprises an estimation by the discriminator of which of the first generated image and the first true image is the first generated image and which is the first true image;
determine, via the GAN, the adversarial loss based at least in part on the first comparison; and
determine, via the GAN, the pixel-wise loss corresponding to a second comparison between the first generated image and the first true image, and wherein the generator is updated such that the updated generator is more likely to generate a second generated image from second image data, corresponding to a second true image, with less error between the second generated image and the second true image than between the first generated image and the first true image.

17. The machine-readable medium of claim 16, wherein, when executed by the at least one processor of the machine, cause the at least one processor to:
determine a discriminator loss based at least in part on the first comparison, wherein the discriminator loss is adaptively adjusted such that the generator and the discriminator learn at a substantially similar rate; and
update the discriminator based at least in part on the discriminator loss.

18. A method of training a generator network, comprising:
determining, over each iteration of a plurality of iterations, an adaptive combined loss comprising a pixel-wise loss and an adversarial loss, wherein the pixel-wise loss corresponds to a direct comparison between a generated image generated by the generator network and a ground truth image, and the adversarial loss corresponds to an estimated comparison between the generated image and the ground truth image estimated by a discriminator network, wherein the adversarial loss is adaptively adjusted based on a ratio between the pixel-wise loss and the adversarial loss such that the ratio is below a threshold;

updating, during each iteration, the generator network based at least in part on the adaptive combined loss such that, in subsequent iterations, the updated generator network is more likely to generate a subsequent generated image that better represents a subsequent ground truth image than the generated image represented the ground truth image; and wherein the adaptive combined loss is adaptively weighted to maintain a moving average of the standard deviation of the gradients (MASDG) of the adversarial loss less than a multiple of the MASDG of the pixel-wise loss.

19. The method of claim 18, wherein the adaptive combined loss comprises a weighted sum of the pixel-wise loss and the adaptively adjusted adversarial loss.

* * * * *